United States Patent [19]

Isobe et al.

[11] Patent Number: 4,513,077

[45] Date of Patent: Apr. 23, 1985

[54] ELECTRON BEAM OR X-RAY REACTIVE IMAGE-FORMABLE RESINOUS COMPOSITION

[75] Inventors: Asao Isobe; Daisuke Makino, both of Hitachi; Hiroshi Shiraishi, Kokubunji, all of Japan

[73] Assignees: Hitachi Chemical Company, Ltd.; Hitachi, Ltd., both of Tokyo, Japan

[21] Appl. No.: 503,634

[22] Filed: Jun. 13, 1983

[30] Foreign Application Priority Data

Jun. 25, 1982 [JP] Japan ................ 57-110252

[51] Int. Cl.³ ............................................. G03C 1/495
[52] U.S. Cl. ................... 430/270; 430/296; 430/942; 430/966; 430/905; 430/326; 204/159.14
[58] Field of Search ............ 430/270, 326, 905, 942, 430/296, 966; 204/159.14

[56] References Cited

U.S. PATENT DOCUMENTS

| | | | |
|---|---|---|---|
| 3,916,036 | 10/1975 | Gipstein et al. | 430/326 X |
| 4,289,845 | 9/1981 | Bowden et al. | 430/326 X |
| 4,377,631 | 3/1983 | Toukhy et al. | 430/326 X |
| 4,409,317 | 7/1984 | Shiraishi | 430/270 |

FOREIGN PATENT DOCUMENTS 53-135621 11/1978 Japan ........................ 430/326

OTHER PUBLICATIONS

J. Barry and R. Wilbarg, "Post Exposure Baking for Improved Photoresist Adhesion", *IBM Technical Disclosure Bulletin*, vol. 24, No. 10, Mar. 1982, p. 5160.

*Primary Examiner*—John Kittle
*Assistant Examiner*—Cynthia Hamilton
*Attorney, Agent, or Firm*—Frishauf, Holtz, Goodman & Woodward

[57] ABSTRACT

There is disclosed an image-formable resinous composition comprising a poly(olefinsulfone) and a matrix polymer, in which the matrix polymer being a novolac phenol resin obtained from:
(1) m-cresol and p-cresol as main components, the molar ratio of m-cresol/p-cresol being within the range from 40/60 to 55/45, and
(2) formaldehyde, the molar ratio of formaldehyde/(phenol or phenol derivatives) being within the range from 5/10 to 8/10.

The image-formable resinous composition has a high sensitivity and a high dissolution.

18 Claims, No Drawings

ELECTRON BEAM OR X-RAY REACTIVE IMAGE-FORMABLE RESINOUS COMPOSITION

This invention relates to an image-formable resinous composition having sensitivity to energy rays such as electron beam, X-ray, etc., particularly to an image-formable resinous composition exhibiting a high sensitivity and a high resolution obtained by combining a poly(olefinsulfone) as a dissolution controller with a novolac phenol resin as a matrix polymer.

Currently, use is made of various resist materials for minute working for semiconductors. As the so-called positive-type resist wherein no resist is formed at the exposed portion, there have been known the photoresist in which a system of a combination of quinonediazide and a phenol resin is employed, and the electron beam resist or the X-ray resins, etc. (hereinafter referred to as energy-ray resist) wherein polymethyl methacrylate, polymethylisopropenyl ketone, polybutene sulfone, etc. is decomposed by a high energy ray such as electron beam, X-ray, etc. These energy-ray resists, when employed for minute working processes, can give minute patterns, but they are primarily etched by way of wet etching in the successive etching process because of their weak dry etching resistances, and hence they are inferior in etching precision. For this reason, it is strongly desired to have an energy-ray resist with a high sensitivity having dry etching resistance. As one way coping with the contradictory requirements of dry etching resistance and high sensitivity to energy-ray, it would be effective for realizing both of sensitivity and dry etching resistance to employ a system as practiced in the photoresist in which the solubility of a phenol resin is decreased by quinonediazide, which is a dissolution inhibitor, and the solubility is improved through the chemical change of quinonediazide by exposure to light. This is attributable to the combination of quinonediazide sensitive to UV-ray and a phenol resin having dry etching resistance in the post-treatment step, which can afford a composition excellent in dry etching resistance as compared with a resin of the type which is itself disintegrated as the result of sensitization to an energy-ray such as polymethyl methacrylate, polymethylisopropenyl ketone, etc.

As a material capable of forming positive-type patterns sensitive to energy-rays such as electron beam, X-ray, etc., there is reported in J. Appl. Polym. Sci. (Journal of Applied Polymer Science) vol.17, p.3211–3221, 1973, application of poly(olefinsulfone) for electron beam resist by utilizing decomposability thereof by electron beam irradiation. It is reported there that poly(butenesulfone) exhibits a sensitivity of $1 \times 10^{-4}$ C/cm$^2$. It is an effective method to employ a poly(olefinsulfone) as a material sensitive to energy-ray and further choose a polymer for a matrix, thereby imparting dry etching resistance to the resultant composition. One example is disclosed as the method for preparation of an article in Japanese Provisional Patent Publication No. 153578/1979. In the above specification, the matrix polymer is chosen from among novolacs and acidic acrylic polymers. The matrix polymer is required to be compatible with poly(olefinsulfone) and give a uniform coated film (J. Appl. Polym. Sci., vol. 26, p.1421–1426, 1981), and also to have an excellent dry etching resistance.

The present inventors have made investigations about various matrix polymers and found that a specific class of novolac phenol resins contribute greatly to high sensitization, and to accomplish the present invention.

The resins known in the art as novolac phenol resins may include pure phenol novolac resins, cresol novolac resins which are methyl phenols, and alkyl phenol novolac resins having other alkyl groups as substituents. In the Example in Japanese Provisional Patent Publication No. 153578/1979, there is shown an example in which a novolac phenol resin is synthesized by use of 126.2 g (1.56 mole) of 37% formaldehyde solution with m-cresol/o-cresol/p-t-butyl phenol (34.0 g/136.0 g/30.0 g, 1.57 mole as total amount). In most cases, however, commercially available alkali soluble novolac phenol resins have been employed. As a rare example, there is disclosed in Japanese Provisional Patent Publication No. 116218/1979, a composition for off-set printing which is improved in affinity for printing ink and acid resistance by a novolac phenol resin obtained by use of a specific amount of tert-alkylphenol together with phenol and cresol.

The mechanism, in which there is created a difference in solubilities in an alkali solution by irradiation of an energy-ray on a system having combined a poly(olefinsulfone) with a novolac phenol resin as a matrix polymer to enable image formation by carrying out a developing treatment, may be outlined as follows.

Even if a matrix itself may be soluble in an alkali solution, a system as a whole in which a poly(olefinsulfone) insoluble in the alkali solution is mixed and dispersed in the matrix becomes apparently substantially insoluble in the alkali solution. This is similar to the system of a combination of a novolac phenol resin with o-quinonediazide, which is one kind of UV-ray resists. The poly(olefinsulfone) is cleaved by energy-ray at its main chain into segments of lower molecular weights, of which some are evaporated due to high volatility and the remaining segments are also weak in dissolution inhibiting effect relative to the alkali solution, whereby the system as a whole becomes soluble in the alkali solution.

Accordingly, the basic dissolving characteristic required for a matrix polymer is desired to be such that it is readily alkali soluble and yet rendered instantly insoluble when a minute amount of a poly(olefinesulfone) is present.

We have attempted improvements of novolac phenol resins with various ratios in solubilities by setting these two conditions and found that novolac phenol resins having materials compositions and molecular weight within specific ranges exhibit markedly excellent properties, to accomplish the present invention.

The present invention concerns an image-formable resinous composition, comprising a poly(olefinsulfone) and a matrix polymer, said matrix polymer being a novolac phenol resin obtained from:

(1) m-cresol and p-cresol as main components, the molar ratio of m-cresol/p-cresol being within the range from 40/60 to 55/45, and (2) formaldehyde, the molar ratio of formaldehyde/(phenol or phenol derivatives) being within the range from 5/10 to 8/10.

The novolac phenol resin to be used in the present invention is compatible with poly(olefinsulfone) resins, and by combination of this resin with a poly(olefinsulfone) as the energy-ray sensitive dissolution inhibitor, the exposed portion can be readily dissolved in an alkali solution, while the unexposed portion remains substantially undissolved to give a very good contrast, thus providing an image-formable resinous composition of a high sensitivity.

The image-formable resinous composition according to the present invention may preferably be used as a positive-type image-formable resinous composition.

The poly(olefinsulfone)s in the present invention are known compounds and can be obtained by the known preparation methods. For example, there are poly(2-methylpentene-1-sulfone), poly(butene-sulfone), poly(cyclohexene-sulfone), poly(2-heptene-sulfone) and the like.

For preparation of the novolac phenol resin in the present invention, there may be employed the conditions conventionally used in the synthetic methods for novolac phenol resins, as disclosed in "Experimental Method for Polymer Synthesis", p.340 (published by Kagaku Dojin, 1972), "Polymer Synthesis Experimental Method", p.261 (published by Tokyo Kagaku Dojin, 1962) and others, except for the molar ratio of m-cresol/p-cresol and the molar ratio of formaldehyde/(phenol or phenol derivatives).

In the matrix polymer of the present invention, it is preferred, after the reaction of formaldehyde and phenol or phenol derivatives, to retain the phenol or phenol derivatives in the resultant reaction mixture in an amount of 1 to 20% by weight, more preferably, 7 to 15% by weight based on the total amount of formaldehyde and phenol or phenol derivatives to be used as a starting material. Moreover, the phenol or phenol derivatives may be reacted all unless remaining therein, and after the reaction, the above-mentioned amount of phenol or phenol derivatives may be added to the resultant reaction mixture.

The matrix polymer in the present invention can be obtained from m-cresol and p-cresol as main components, but it is also possible to use o-cresol or an alkyl phenol, phenol, etc. other than m-cresol and p-cresol.

Formaldehyde is allowed to react as formalin, paraformaldehyde or the like. The reactants such as m-cresol, p-cresol, formaldehyde and others are allowed to react, for example, at 70° to 110° C. for 1 to 20 hours. In this reaction, there may be employed an organic or inorganic acid catalyst such as oxalic acid, sulfuric acid, hydrochloric acid, nitric acid and the like. After the reaction, the reaction mixture becomes turbid, which is then left to stand and the supernatant aqueous layer is removed by separation, followed by desolventization. Desolventization may be performed according to the method by vacuum distillation, the method in which thin film vaporization is effected with a large volume of a gas, azeotropic dehydration or desolventization by use of benzene or toluene, etc.

In desolventization, methanol in formalin, water formed and a part of all of unreacted phenol or phenol derivatives are removed. It is preferred to elevate the temperature under a reduced pressure of 50 to 100 mmHg until there is no distillate at 120° to 200° C., or to perform azeotropic dehydration by use of an appropriate amount of benzene, toluene, xylene, etc. as an azeotropic solvent and then remove the azeotropic solvent. At a molar ratio of m-cresol/p-cresol greater than 55/45, the solubility of the novolac phenol resin in an alkali is lowered, while at a ratio less than 40/60, the solubility in an alkali is too high to give the effect of the present invention. The total amount of m-cresol and p-cresol may comprise 90% of the phenol or phenol derivatives to be reacted with formaldehyde to give favorable results.

In the present invention, the molar ratio of formaldehyde/(phenol or phenol derivatives) is defined within the range from 5/10 to 8/10. In this case, phenol or phenol derivatives are inclusive of o-cresol, alkyl phenols, phenol, etc. in addition to m-cresol and p-cresol, if they are used. At a level lower than said range, the novolac resin has a low molecular weight to be excessively dissolved in an alkali solution, while at a higher level, gellation is caused during the reaction.

In the present invention, the poly(olefinsulfone) resin and the novolac phenol resin may be used at a weight ratio preferably of poly(olefinsulfone)/novolac phenol resin within the range from 5/95 to 50/50.

The image-formable resinous composition according to the present invention is used as a solution. As the solvent, there may be employed isoamyl acetate, chlorobenzene/butyl acetate solvent mixture, methyl cellosolve acetate/cyclohexane solvent mixture, acetone and others. Among them isoamyl acetate is preferred.

The composition according to the present invention may also contain, if desired, as the third component a fluorine type, silicon type surfactant, silane coupling agent in an amount of 0 to 5% by weight based on poly(olefinsulfone) and novolac phenol resin.

The present invention is illustrated below by referring to Examples.

SYNTHESIS EXAMPLE 1

| m-Cresol | 135 g (1.25 mol) |
| p-Cresol | 135 g (1.25 mol) |
| 35% Formalin | 139.3 g (1.63 mol) |
| Conc. HCl | 0.4 ml |

The above components were weighed into a flask of 500 ml capacity equipped with a fractional distillator, a reflux condenser and a stirring means and, while stirring the mixture, the temperature was elevated on an oil bath. After the reaction was carried out at 90° C. for 2 hours, the reaction mixture was left to cool. After removal of the supernatant layer, the remaining mixture was heated again while passing nitrogen gas thereinto, and water, solvent and unreacted cresols distilled out were removed as separate streams. Heating was conducted while gradually elevating the temperature up to 175° C., and the contents of the flask were poured over a stainless steel vat and cooled. The resultant novolac phenol resin had a weight average molecular weight of 3000, an unreacted cresol content of 12% and a softening point of 125° C.

SYNTHESIS EXAMPLE 2

| m-Cresol | 135 g (1.25 mol) |
| p-Cresol | 135 g (1.25 mol) |
| 33% Formalin | 150 g (1.75 mol) |
| Conc. HCl | 0.4 ml |

The above components were weighed into a flask of 500 ml capacity equipped with a fractional distillator, a reflux condenser and a stirring means, heated on an oil bath to be elevated to 90° C., and maintained thereat to carry out the reaction under stirring for 5 hours. Then, 100 ml of toluene was added and azeotropic dehydration was conducted while heating the mixture. About 120 ml of water was removed by azeotropic dehydration. The reaction mixture was elevated to 160° C. while blowing nitrogen gas thereinto to recover toluene by distillation. The contents in the flask were flown out over a stainless steel vat and cooled. The resultant novolac phenol resin is a pale yellow solid, having a softening point of 120° C., an unreacted cresol content of 10% and a weight average molecular weight of 3300.

COMPARATIVE SYNTHESIS EXAMPLE 1

| Synthetic cresol (m-/p-molar ratio = 6/4) | 270 g (2.5 mol) |
| --- | --- |
| 35% Formalin | 150 g (1.75 mol) |
| Oxalic acid dihydrate | 1 g |

The above components were weighed into a flask of 500 ml capacity equipped with a reflux condenser and a stirring means, heated on an oil bath to be elevated to 90° C. and refluxed thereat for 2 hours. The reaction mixture was washed with water and the aqueous layer was removed by decantation, followed by dehydration under reduced pressure by means of an evaporator under a reduced pressure of 50 to 100 mmHg. Heating was conducted while gradually elevating the temperature up to finally 170° C. The contents were flown out over a stainless steel vat and cooled. The resultant novolac resin had a softening point of 120° C., an unreacted cresol content of 3% and a weight average molecular weight of 3500.

COMPARATIVE SYNTHESIS EXAMPLE 2

| m-Cresol | 81 g (0.75 mol) |
| --- | --- |
| p-Cresol | 189 g (1.75 mol) |
| 35% Formalin | 150 g (1.75 mol) |
| Conc. HCl | 0.4 ml |

Using the above components, synthesis was carried out according to the same synthetic method as in Synthesis example 2 to obtain a novolac phenol resin. The resultant novolac phenol resin had a softening point of 110° C., an unreacted cresol content of 15% and a weight average molecular weight of 2500.

COMPARATIVE SYNTHESIS EXAMPLE 3

| m-Cresol | 135 g (1.25 mol) |
| --- | --- |
| p-Cresol | 135 g (1.25 mol) |
| 35% Formalin | 214 g (2.5 mol) |
| Conc. HCl | 0.2 ml |

Using the above components, synthesis was carried out according to the same synthetic method as in Synthesis example 1. However, when stirring was performed for one hour at 90° C., the viscosity was increased too high to make stirring any longer possible.

COMPARATIVE SYNTHESIS EXAMPLE 4

| m-Cresol | 135 g (1.25 mol) |
| --- | --- |
| p-Cresol | 135 g (1.25 mol) |
| 35% Formalin | 85.7 g (1.0 mol) |
| Conc. HCl | 0.4 ml |

Using the above components, synthesis was carried out according to the same synthetic method as in Synthesis example 1 to obtain a novolac phenol resin. The resultant novolac phenol resin was viscous even at room temperature and had a weight average molecular weight of 1300.

SYNTHESIS EXAMPLE 3

| m-Cresol | 133.6 g (1.24 mol) |
| --- | --- |
| p-Cresol | 109.4 g (1.01 mol) |
| o-Cresol | 27 g (0.25 mol) |
| 35% Formalin | 139.3 g (1.63 mol) |
| Conc. HCl | 0.4 ml |

Using the above components, synthesis was carried out according to the same synthetic method as in Synthesis example 1 to obtain a novolac phenol resin, having a softening point of 115° C., a weight average molecular weight of 2500 and an unreacted cresol content of 10%.

SYNTHESIS EXAMPLE 4

In a 100 ml flask was fluxed 2-methylpentene-1 on lithium aluminum hydroxide for about 1 hour to remove peroxides. The product was subjected to vacuum distillation to obtain 50 ml of purified 2-methypentene-1 in a reaction vessel having placed a stirrer therein. The reaction vessel was connected to a vacuum system and degassing was performed by repeating twice the freezing degassing treatment. The reaction vessel was then cooled to −90° C. In the reaction vessel was condensed 100 ml of sulfur dioxide dehydrated with phosphorus pentaoxide. Further, 3 g of t-butyl hydroperoxide, which had previously been subjected to vacuum distillation and degassing repeated twice, was transferred under vacuum into the reaction vessel by vacuum distillation.

The reaction mixture was gradually warmed up, and stirred with an electromagnetic stirrer so that the entire mass may become homogeneous. The reaction temperature was maintained at −50° to −40° C. After about 5 hours, excessive sulfur dioxide was removed by distillation. The reaction mixture was returned to room temperature, was dissolved in acetone and was precipitated in methanol. The polymer precipitated was crushed and dried at 30° C. under vacuum to obtain poly(2-methylpentene-1-sulfone).

EXAMPLE 1

| (2-methylpentene-1-sulfone) prepared in Synthesis example 4 | 0.1 g |
| --- | --- |
| Novolac phenol resin prepared in Synthesis example 1 | 1.0 g |
| Isoamyl acetate | 5 ml |

A solution of the above composition was prepared. This solution was coated by rotary coating on a silicon wafer of 3 inch at about 2000 r.p.m., followed by drying at 100° C. for 10 minutes, to obtain a dried coated film with a film thickness of 0.5 $\mu$m. The coated silicon wafer was exposed stepwise by means of a 20 KV electron beamm irradiating device at incident doses of 0.1 to 10 $\mu$C/cm$^2$. When developed with an aqueous 2.0% tetramethylammonium hydroxide solution, the exposed portion was dissolved within 30 to 60 seconds to find that it had a sensitivity of 1 $\mu$C/cm$^2$ from the exposure characteristic curve. Further, when confirmed by elongating the developing time to two-fold, the film thickness reduction at the unexposed portion was excellently as small as 5% or less.

COMPARATIVE EXAMPLE 1

| | |
|---|---|
| (2-methylpentene-1-sulfone) prepared in Synthesis example 4 | 0.1 g |
| Novolac phenol resin prepared in Comparative synthesis example 1 | 1.0 g |
| Isoamyl acetate | 5 ml |

A solution of the above composition was prepared. Similarly as in Example 1, was obtained on a silicon wafer of 3 inch a dried coated film with a film thickness of 0.5 um. The coated silicon wafer was exposed stepwise by means of a 20 KV electron beam irradiating device at incident doses of 0.1 to 10 $\mu C/cm^2$. When developed with an aqueous 2.0% tetramethylammonium hydroxide solution, the exposed portion was dissolved within 60 to 80 seconds to find that it had a sensitivity of 5 $\mu C/cm^2$ from the exposure characteristic curve. However, when the developing time was increased to 150 seconds, a film thickness reduction as much as 20% was observed even at the unexposed portion, and the surface was also found to be roughened as the result of observation by electron microscope.

EXAMPLES 2-3

Experiments were conducted according to the same procedure as in Example 1 by use of solutions having the following formulations to obtain the results shown below in the Table.

COMPARATIVE EXAMPLES 2-4

Experiments were conducted according to the same procedure as in Example 1 by use of comparative solutions having the following formulations to obtain the results shown below in the Table.

TABLE

| Sample No. | Novolac phenol resin | Poly(olefinsulfone) | Minimum development time (sec) | Sensitivity ($\mu C/cm^2$) | Film reduction (%) |
|---|---|---|---|---|---|
| Example 2 | Resin of Synthesis example 2 (1.0 g) | Poly(2-methyl-pentene-1-sulfone), (0.1 g) | 45 | 1 | 5 or less |
| Comparative example 2 | Resin of Comparative synthesis example 1 (1.0 g) | Poly(2-methyl-pentene-1-sulfone), (0.1 g) | 60 | 4 | 20 |
| Comparative example 3 | Resin of Comparative synthesis example 2 (1.0 g) | Poly(2-methyl-pentene-1-sulfone), (0.1 g) | 30 | 3 | 25 |
| Comparative example 4 | Resin of Comparative synthesis example 4 (1.0 g) | Poly(2-methyl-pentene-1-sulfone), (0.1 g) | 10 | — | 90 or more |
| Example 3 | Resin of Synthesis example 3 (1.0 g) | Poly(2-methyl-pentene-1-sulfone), (0.1 g) | 30 | 1 | 5 or less |

Note
Poly(2-methylpentene-1-sulfone) employed was that prepared in Synthesis example 4.

As can be seen from Examples, according to the image-formable resinous composition of the present invention, the difference in solubility between the portion exposed to an energy-ray and other portion is increased to a great extent as compared with that of the prior art, whereby the sensitivity of the prior art which was practically at most around 3 $\mu C/cm^2$ can be increased to a three-fold sensitivity of 1 $\mu C/cm^2$. This results in speed-up of drawing of images by electron beam to enable commercial applications not only in photomasks but also in direct drawing of images.

We claim:

1. An electron beam or x-ray reactive image-formable resinous composition comprising a poly(olefinsulfone) and a matrix polymer, said matrix polymer being a novolac phenol resin obtained from the reaction of:
   (1) a mixture consisting essentially of (i) at least 90% by weight of m-cresol and p-cresol as main components wherein the molar ratio of m-cresol/p-cresol is within the range of from 40/60 to 55/45 and (ii) from 0 to 10% of at least one phenolic compound selected from the group consisting of phenol and a derivative of phenol other than m-cresol and p-cresol; and
   (2) formaldehyde, wherein the molar ratio of formaldehyde to the amount of said mixture is within the range of from 5/10 to 8/10.

2. The resinous composition of claim 1, wherein said mixture contains m-cresol and p-cresol in an amount of at least 90% by weight, and the balance of said mixture contains at least one component selected from the group consisting of, alkyl phenol and phenol.

3. The resinous composition of claim 1, wherein the weight ratio of said poly(olefinsulfone) to said novolac phenol resin is within the range of from 5/95 to 50/50.

4. The resinous composition of claim 1, wherein said composition is in the form of a solution containing a solvent selected from the group consisting of isoamyl acetate, a mixture of chlorobenzene and butyl acetate, a mixture of methyl cellosolve acetate and cyclohexane, acetone and mixtures thereof.

5. The resinous composition of claim 1, wherein said composition further comprises, as a third component, at least one substance selected from the group consisting of a fluorine type surfactant, a silicon type surfactant and a silane coupling agent.

6. The resinous composition of claim 5, wherein said third component is present in an amount of up to 5% by weight based on the weight of said poly(olefinsulfone) and novolac phenol resin.

7. The resinous composition of claim 1, wherein said poly(olefinsulfone) is a compound selected from the group consisting of poly(2-methyl-pentene-1-sulfone), poly(butene-sulfone), poly(cyclohexene-sulfone) and poly(2-heptene-sulfone).

8. The resinous composition of claim 1, wherein said matrix polymer contains said phenolic compound in an amount of from 1 to 20% by weight based on the total amount of formaldehyde and said phenolic compound used as a starting material.

9. The resinous composition of claim 8, wherein said matrix polymer contains said phenolic compound in an amount of from 7 to 15% by weight.

10. The resinous composition of claim 1, wherein the molar ratio of m-cresol/p-cresol is within the range of 50/50 to 55/45.

11. An electron beam or x-ray reactive image-formable resinous composition comprising a poly(olefinsulfone) selected from the group consisting of poly(2-methyl-pentene-1-sulfone), poly(butene-sulfone), poly(cyclohexene-sulfone) and poly(2-heptene-sulfone) and a matrix polymer, said matrix polymer being a novolac resin obtained from the reaction of:
  (1) a mixture consisting essentially of (i) m-cresol and p-cresol in an amount of up to 90% by weight, wherein the molar ratio of m-cresol/p-cresol is within the range of from 40/60 to 55/45 and (ii) from 0 to 10% of at least one phenolic compound selected from the group consisting of phenol and a derivative of phenol other than m-cresol and p-cresol; and
  (2) formaldehyde, wherein the molar ratio of formaldehyde to the amount of said mixture is within the range of from 5/10 to 8/10, and wherein the weight ratio of said poly(olefinsulfone) to said novolac phenol resin is within the range of from 5/95 to 50/50.

12. The resinous composition of claim 11, wherein said phenolic compound is at least one compound selected from the group consisting of, alkylphenol and phenol.

13. The resinous composition of claim 11, wherein said composition is in the form of a solution containing a solvent selected from the group consisting of isoamyl acetate, a mixture of chlorobenzene and butyl acetate, a mixture of methyl cellosolve acetate and cyclohexane, acetone and mixtures thereof.

14. The resinous composition of claim 11, wherein said composition further comprises, as a third component, at least one substance selected from the group consisting of a fluorine type surfactant, a silicon type surfactant and a silane coupling agent.

15. The resinous composition of claim 14, wherein said third component is present in an amount of up to 5% by weight based on the weight of said poly(olefinsulfone) and novolac phenol resin.

16. The resinous composition of claim 11, wherein said matrix polymer contains said phenolic compound in an amount of from 1 to 20% by weight based on the total amount of formaldehyde and said phenolic compound used as a starting material.

17. The resinous composition of claim 16, wherein said matrix polymer contains said phenolic compound in an amount of from 7 to 15% by weight.

18. The resinous composition of claim 11, wherein the molar ratio of m-cresol/p-cresol is within the range of 50/50 to 55/45.

* * * * *